(12) United States Patent
London

(10) Patent No.: US 8,093,761 B2
(45) Date of Patent: Jan. 10, 2012

(54) BIPOLAR PULSE GENERATORS WITH VOLTAGE MULTIPLICATION

(75) Inventor: Simon Y. London, Rockville, MD (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/180,753

(22) Filed: Jul. 12, 2011

(65) Prior Publication Data

US 2011/0266887 A1 Nov. 3, 2011

Related U.S. Application Data

(62) Division of application No. 12/588,238, filed on Oct. 8, 2009, now Pat. No. 7,986,060, which is a division of application No. 11/269,847, filed on Nov. 9, 2005, now Pat. No. 7,633,182.

(51) Int. Cl.
*H03K 3/42* (2006.01)
(52) U.S. Cl. ............................ 307/106; 333/20; 327/171
(58) Field of Classification Search .................. 307/106, 307/107, 419, 421; 327/171; 333/20
See application file for complete search history.

(56) References Cited

U.S. PATENT DOCUMENTS

| | | |
|---|---|---|
| 2,420,302 A | 8/1943 | Darlington |
| 2,496,979 A | 9/1945 | Blumlein et al. |
| 2,769,101 A | 7/1955 | Drosd |
| 3,435,431 A | 3/1969 | Baer et al. |
| 3,612,899 A | 10/1971 | Ross et al. |
| 3,668,416 A | 6/1972 | Marilleau |
| 3,832,568 A | 8/1974 | Wang |
| 3,898,569 A * | 8/1975 | Radcliffe ...................... 327/170 |
| 4,227,153 A | 10/1980 | Birx |

(Continued)

FOREIGN PATENT DOCUMENTS

JP 3034737 2/1991

(Continued)

OTHER PUBLICATIONS

Graft, Rudolph F. Radio Shack Dictionary of Electronics, 1978, Howard W. Sams & Co., Inc. 5th Ed., p. 764.

(Continued)

*Primary Examiner* — Thomas J Hiltunen
(74) *Attorney, Agent, or Firm* — Bingham McCutchen LLP; Robert C. Bertin; Daniel J. Long

(57) ABSTRACT

A bipolar pulse generator includes two, two-conductor transmission lines coupled together with a load positioned between the two transmission lines. Each conductor of a transmission line we define as a segment. Two segments of one transmission line are charged and switchably coupled to two segments of the other transmission line to produce a bipolar pulse on the matched load. This bipolar pulse generator may be implemented in a flat or a folded design. The generator may include two transmission line structures coupled together with a load positioned between each transmission line structures. The first transmission line structure may include a stepped transmission line and an embedded transmission line segment. A switch may be coupled between the embedded transmission line segment and another segment of the transmission line structure. During operation, the first transmission line structure may be charged to a potential with the switch in the open position and, when the switch is closed, the charge on the first transmission line structure together with the second transmission line structure generates a bipolar pulse on the matched load.

10 Claims, 12 Drawing Sheets

U.S. PATENT DOCUMENTS

| | | | |
|---|---|---|---|
| 4,482,816 A | 11/1984 | Richardson et al. | |
| 4,536,723 A | 8/1985 | Lang | |
| 4,667,161 A | 5/1987 | Wilcox | |
| 4,670,662 A | 6/1987 | Goldstein et al. | |
| 4,727,262 A | 2/1988 | O'Loughlin | |
| 4,888,556 A | 12/1989 | Buttram et al. | |
| 5,001,748 A | 3/1991 | Burns et al. | |
| 5,118,969 A * | 6/1992 | Ikezi et al. | 307/419 |
| 5,138,270 A | 8/1992 | Nakata et al. | |
| 5,138,622 A | 8/1992 | Friede et al. | |
| 5,331,213 A | 7/1994 | Ohmori et al. | |
| 5,444,308 A * | 8/1995 | O'Loughlin | 307/106 |
| 5,736,882 A | 4/1998 | Witte | |
| 5,764,501 A | 6/1998 | Limpaecher | |
| 6,466,627 B1 | 10/2002 | Kuwana | |
| 6,674,806 B1 | 1/2004 | Toda | |
| 7,268,641 B2 * | 9/2007 | Zucker et al. | 333/20 |
| 7,342,436 B2 | 3/2008 | Tsuchiya et al. | |
| 7,365,615 B2 | 4/2008 | Zucker et al. | |
| 7,440,568 B2 * | 10/2008 | Rhodes | 379/413.04 |
| 7,518,464 B2 * | 4/2009 | London | 333/20 |
| 7,576,499 B2 * | 8/2009 | Caporaso et al. | 315/505 |
| 7,583,159 B2 * | 9/2009 | London | 333/20 |
| 7,679,297 B1 * | 3/2010 | Stygar et al. | 315/505 |
| 7,692,509 B2 * | 4/2010 | London | 333/20 |
| 7,884,504 B2 * | 2/2011 | Tao et al. | 307/106 |
| 2007/0013315 A1 | 1/2007 | Rhodes | |
| 2008/0224794 A1 | 9/2008 | London | |
| 2008/0265778 A1 | 10/2008 | Rhodes | |
| 2010/0059665 A1 * | 3/2010 | Sampayan | 250/251 |
| 2011/0273028 A1 * | 11/2011 | London | 307/106 |

FOREIGN PATENT DOCUMENTS

| | | |
|---|---|---|
| RU | 122823 | 12/1958 |
| RU | 1 098 502 | 9/1996 |
| RU | 2 128 877 | 4/1999 |

OTHER PUBLICATIONS

MacGregor, S.J. et al., A Combined High Voltage, High-Energy Pulse Generator, Meas. Sci. Tech. 5, Aug. 18, 1994, pp. 1580-1582.

MacGregor, S.J. et al., A Novel HV Double Pulse Modulator, Meas. Sci. Techn. 5, Jul. 14, 1994, pp. 1407-1408.

Smith, Ian, Linear Induction Accelerators Made From Pulse-Line Cavities With External Pulse Injection, Rev. Sci. Instrum. 50(6), Jun. 1979, pp. 714-718.

* cited by examiner

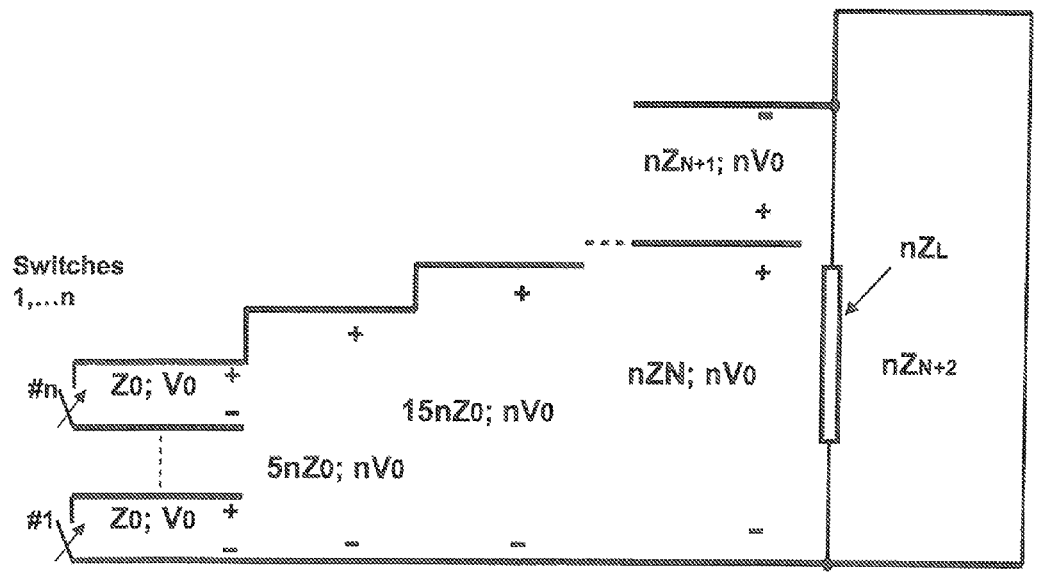
FIGURE 10A
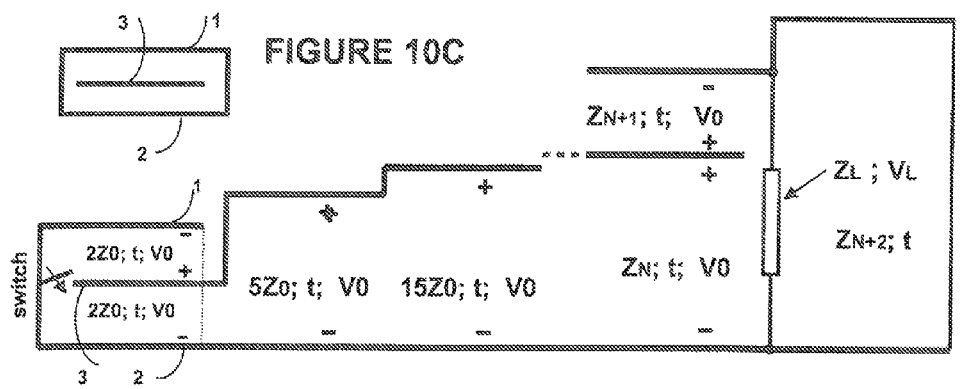
FIGURE 10C
FIGURE 10B

Normalized Impedances and Voltage Ratios for N = 1...12 (Fig. 9a and transformed circuit by applying Fig.14a);
Z1 =1 Ohm; $Z_{N+2}=Z_L \cdot (N+2)$; V0 =1V. Normalized values of $Z_{N+1}$ and $Z_{N+2}$ for transformed circuit are not shown Table1

| N | Z2 | Z3 | Z4 | Z5 | Z6 | Z7 | Z8 | Z9 | Z10 | Z11 | Z12 | $Z_{N+1}$ | $Z_L$ Fig.9a | $V_L$ Fig.9a | $Z_L$ transformed | $V_L$ transformed |
|---|----|----|----|----|----|----|----|----|-----|-----|-----|-----------|--------------|--------------|-------------------|-------------------|
| 1 |    |    |    |    |    |    |    |    |     |     |     | 3         | 8/3          | 2/3          | 27/8              | 3/4               |
| 2 | 5  |    |    |    |    |    |    |    |     |     |     | 7.5       | 75/8         | 5/4          | $8.5^2/6$         | 17/12             |
| 3 | 5  | 15 |    |    |    |    |    |    |     |     |     | 15        | 24           | 2            | 243/8             | 9/4               |
| 4 | 5  | 15 | 35 |    |    |    |    |    |     |     |     | 26.25     | $35^2/24$    | 35/12        | 507/8             | 39/12             |
| 5 | 5  | 15 | 35 | 70 |    |    |    |    |     |     |     | 42        | 96           | 4            | $53^2/8$          | 53/12             |
| 6 | 5  | 15 | 35 | 70 | 126|    |    |    |     |     |     | 63        | 1323/8       | 21/4         | $3*23^2/8$        | 23/4              |
| 7 | 5  | 15 | 35 | 70 | 126| 210|    |    |     |     |     | 90        | 800/3        | 20/3         | $3*29^2/8$        | 29/4              |
| 8 | 5  | 15 | 35 | 70 | 126| 210| 330|    |     |     |     | 123.75    | 3267/8       | 33/4         | $107^2/24$        | 109/12            |
| 9 | 5  | 15 | 35 | 70 | 126| 210| 330| 495|     |     |     | 165       | 600          | 10           | $129^2/24$        | 43/4              |
| 10| 5  | 15 | 35 | 70 | 126| 210| 330| 495| 715 |     |     | 214.5     | 20449/24     | 143/12       | $153^2/24$        | 51/4              |
| 11| 5  | 15 | 35 | 70 | 126| 210| 330| 495| 715 | 1001|     | 273       | 1176         | 14           | $179^2/24$        | 179/12            |
| 12| 5  | 15 | 35 | 70 | 126| 210| 330| 495| 715 | 1001| 1365| 341.25    | 12675/8      | 65/4         | $3*69^2/8$        | 69/4              |

FIGURE 17

BIPOLAR PULSE GENERATORS WITH VOLTAGE MULTIPLICATION

REFERENCE TO RELATED APPLICATION

This application is a divisional of and claims the benefit of priority to prior U.S. patent application Ser. No. 12/588,238 by inventor Simon Y. London, entitled "Bipolar Pulse Generators with Voltage Multiplication", which is a divisional of and claims the benefit of priority to prior U.S. Pat. No. 7,633,182 by inventor Simon Y. London, entitled "Bipolar Pulse Generators with Voltage Multiplication" filed on Nov. 9, 2005.

FIELD OF THE INVENTION

The present invention relates generally to bipolar pulse generators and, more particularly, bipolar pulse generators that incorporate voltage or current multiplication circuitry.

BACKGROUND OF THE INVENTION

Modern trends in High Power Microwave (HPM) sources for a variety of applications are directed to increasing radiated power and efficiency as well as to increasing energy density (energy per unit volume). Transmission line pulse generators with photoconductive switches could achieve some of the best results.

High powered and high energy density transmission line pulse generators imply low and very low (mOhm range) characteristic impedances of transmission lines by using thin dielectrics. This low range of characteristic impedances frequently causes problems when coupling high powered and high energy density transmission line pulse generators with radiating impedances. In this scenario, the total value of impedance transformation may increase by, for example, 1:1000.

FIG. 1(a) illustrates a schematic of a well-known bipolar pulse generator. In this generator, with a closing switch, the matched load impedance is equal to the characteristic impedance of the transmission line, and voltage on the load is equal to ½ of the charged voltage of the transmission lines. The ideal waveform on the load is shown in FIG. 1(b).

A more complicated circuit shown in FIG. 2, also based on a closing switch. It provides a higher load impedance and a load voltage equal to ¾ of the voltage of the charged transmission line. Further increasing the load impedance with respect to the lowest characteristic impedance of the transmission line, and higher load voltage has been achieved in a relatively complicated structure shown in FIG. 3. For all of these circuits to achieve impedance for effective radiation, an additional high ratio step-up impedance transformer must be used as shown in FIG. 4.

Impedance transformers used to perform impedance transformations starting from low impedances may have especially low efficiency and large sizes. Therefore, the transformers themselves can defeat some of the advantages of high powered and high energy density transmission line generators. Moreover, problems presently exist with creating impedance transformers that increase impedance by large ratios.

For unipolar pulses, stepped transmission line pulse generators have been used by S. Darlington and provide impedance transformation depending on the number of charged, stepped transmission lines. Increased impedance transformation is achieved by applying increased (different) charging voltage on transmission lines and using extra switches. Such a design is complicated.

Bipolar pulses from high power sources provide two or more times higher radiation efficiency, due to differences in frequency spectra, compared to unipolar pulses. However, Bipolar pulse generators with electrical energy storage in charged transmission lines conventionally have not provided enough impedance transformations based on charged stepped transmission lines. Accordingly, for high efficiency of bipolar generation systems with conventional, for example exponential, transformers, the total size has conventionally been large and the designs complicated or impractical. Accordingly, there remains a need for a bipolar pulse generator solution based on Only voltage charged transmission lines that is capable of implementing high impedance transformation ratios ($\geqq 100$) starting from tenths of mOhm. There is a further need for a bipolar pulse generator that is capable of being implemented in a simple structure. There is a further need for a high efficiency design that has a relatively low total size. There is a further need for such a system that allows simple access by fibers to a closing photoconductive switch that actuates the bipolar pulse generator. There is still a further need for a bipolar pulse generator that provides current multiplication in a simple structure.

SUMMARY OF THE INVENTION

According to the present invention, a bipolar pulse generator includes two, two-conductor transmission lines coupled together with a load positioned between the two transmission lines. Each conductor of a transmission line we define as a segment. Two segments of one transmission line are charged and switchably coupled to two segments of the other transmission line to produce a bipolar pulse on the matched load. This bipolar pulse generator may be implemented in a flat or a folded design.

According to another embodiment of the present invention, a bipolar pulse generator may include two transmission line structures coupled together with a load positioned between the two transmission line structures. The first transmission line structure may include an embedded transmission line segment. A switch may be coupled between the embedded transmission line segment and another segment of the transmission line structure. During operation, the embedded transmission line structure may be charged to a potential with the switch in the open position and, when the switch is closed, the charge on the first transmission line structure together with the second transmission line structure generates a bipolar pulse on the matched load.

According to still another embodiment of the present invention, the bipolar pulse generator may further include a stepped transmission line between the switch and the embedded transmission line segment that facilitates impedance transformation. The impedance of the stepped transmission line may increase for each successive step. Moreover, the load and the second transmission line structure may have impedances that are higher than the stepped transformer. The bipolar pulse generator according to these embodiments may have a small overall length and high efficiency and may be useful in HPM generation, in particle accelerators and in other high voltage physical instruments and test equipment.

BRIEF DESCRIPTION OF THE FIGURES

The above described features and advantages of the present invention will be more fully appreciated with reference to the detailed description and figures, in which:

FIG. 10(a) depicts a schematic of a N-stage bipolar pulse generator with stacked switched lines, according to an embodiment of the present invention.

FIG. 10(b) depicts a schematic of a N-stage bipolar pulse generator with two parallel connected transmission lines in the first stage according to an embodiment of the present invention.

FIG. 10(c) depicts a cross section of the first stage of a N-stage bipolar pulse generator, according to an embodiment of the present invention.

FIG. 17 depicts a table of parameters for 1 to 12 stage bipolar pulse generators as shown in FIG. 9(a) according to an embodiment of the present invention.

DETAILED DESCRIPTION

According to the present invention, a bipolar pulse generator includes two, two-conductor transmission lines coupled together with a load positioned between the two transmission lines. One transmission line is charged and is switchably coupled to the second transmission line to produce a bipolar pulse on a matched load. This bipolar pulse generator may be implemented in a flat or a folded design. Each conductor of the transmission line will be termed a segment. A transmission line includes at least two conductors, i.e. two segments.

Figure 5A:
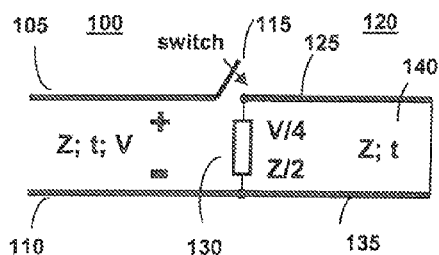
FIG. 5(a) depicts the simplest schematic of a bipolar pulse generator according to an embodiment of the present invention.

In FIG. 5a, the simplest bipolar pulse generator circuit, according to an embodiment of the present invention is shown. Referring to FIG. 5a, two transmission line structures 100, which is a simple transmission line in this case, and 120, are coupled together through switch 115. The switch 115 couples the segment 105 of transmission line structure 100 to segment 125 of transmission line structure 120. In addition, load 130 couples segment 125 to segment 135 within the second transmission line structure 120. Opposite ends of the segments 125 and 135 in transmission line 140 are connected together.

During operation, the switch 115 is initially open. This allows segment 105 to be charged relative to segment 110 of transmission line structure 100 by a voltage V, as indicated in FIG. 5a. Next, the switch 115 is closed, which causes the discharge of transmission line structure 100 into a parallel connected load 130 and a transmission line 140 in structure 120. The resulting impedance of load 130, which is Z/2, together with transmission line 140 having a characteristic impedance of Z, is in total equal to Z/3. Therefore, the positive voltage pulse with magnitude V/4 appears on the load 130 and also starts to propagate in transmission line 140 with half of the power (compared to that which is dissipated in the load 130) toward the short-circuit end, where segments 125 and 135 are connected together. When the switch 115 is closed, a negative voltage pulse having a magnitude of −3V/4 starts to propagate in the transmission line 100 toward its open end.

The time delay t is the same for both transmission lines 100 and 140. Therefore, after time interval t, the pulse having a magnitude of −3 V/4 in transmission line 100 and the pulse having a magnitude of V/4 in transmission line 140 appear at the open end of transmission line 100 and on the short-circuited end of transmission line 140, respectively.

Figure 5B:
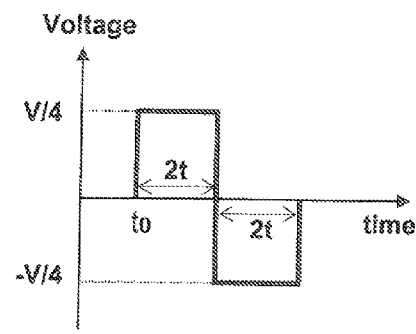
FIG. 5(b) depicts an ideal pulse form provided by the generator of FIG. 5(a).

At the open end of the transmission line 100, this negative pulse is reflected also as a negative −3V/4 magnitude pulse. At the same time, a positive pulse at the short-circuited end of the transmission line 140 is reflected back to the load 130 as a negative pulse with the same magnitude. After another time interval t, both pulses reach the load 130. At this moment, i.e. after a time interval 2t from when the switch 115 is closed, positive voltage V/4 appears on the load 130, and half of the energy initially stored in transmission line 100 is delivered to the load 130. During the second time period, 2t after the moment when both negative pulses reach the load 130, the voltage on the load 130 is negative and equal to −V/4. Therefore, the second half of the energy initially stored in the transmission line 100 will be dissipated in load 130. Assuming the circuit of FIG. 5a is lossless, the efficiency of transferring storage energy to the load 130 is 100%. The resulting pulse formed on load 130 is illustrated on FIG. 5b.

Figure 6A:
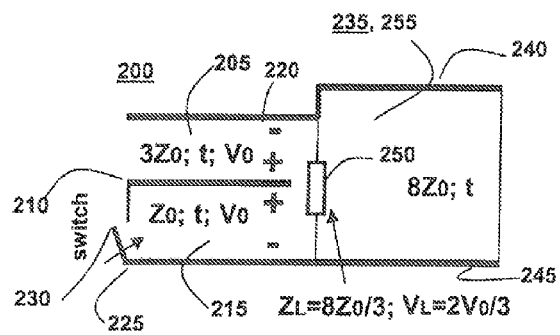
FIG. 6(a) depicts a schematic of a single-stage bipolar pulse generator according to an embodiment of the invention.

FIG. 6a depicts a single stage bipolar pulse generator according to an embodiment of the present invention. Referring to FIG. 6a, the first transmission line structure 200 includes transmission lines 205 and 215 with an embedded segment 210. Segment 210 with segment 220 form transmission line 205, while segment 210 with segment 225 form transmission line 215. Segments 210 and 225 are coupled through switch 230. Both transmission lines 205 and 215 form the first transmission line structure 200.

The second transmission line structure 235 includes segments 240 and 245 and load 250. Segment 240 and segment 245 form transmission line 255, which is coupled to load 250 and to the first transmission line structure 200. In addition, the characteristic impedance of transmission line 215 is Z0 , and the characteristic impedance (shortly impedance) of transmission line 205 is equal to 3Z0. Transmission line 255 of the second transmission line structure 235 has an impedance equal to 8Z0, and the impedance of the load 250 is equal to one third of the impedance of transmission line 255, i.e., 8Z0/3. The transit time of each of the three transmission lines 205, 215 and 255 is t, as indicated on FIG. 6(a).

Figure 6B:
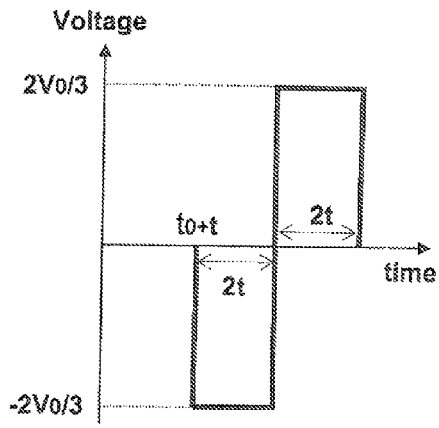
FIG. 6(b) depicts an ideal pulse form provided by the generator of FIG. 6(a).

During the operation, the embedded transmission line segment 210 is charged to a voltage V0, relative to segments 220 and 225. When the two transmission lines 205 and 215 are completely charged, the switch 230 is closed and at this moment, a negative pulse −V0 starts to propagate along the transmission line 215 toward the opposite (opened) end. After time t (the delay of each transmission line), this negative pulse reaches the opposite end of the transmission line 215 and the total voltage between segments 220 and 225 is immediately changed from zero to minus 2V0. At this moment the situation is similar to that of FIG. 5a. The charged series of connected transmission lines 205 and 215 with resulting impedance 4Z0 start to discharge into parallel connected load 250 and transmission line 255. The resulting impedance of the load 250 and transmission line 255 is equal 2Z0. Therefore, a resulting negative pulse (−2V0/3) appears on the load 250 and starts to propagate along the transmission line 255 with three times lower power (compared to that which is dissipated in the load 250) toward the short-circuited end when segments 240 and 245 are coupled. By analogy to FIG. 5a, but with opposite (positive) polarity and a different magnitude (4V0/3), a pulse is split between transmission lines 205 and 215 in proportion to their impedances and starts to propagate on these lines toward the open end of transmission line 205 and toward the short-circuited end (closed switch) of transmission line 215. During a double transient time 2t of each of the transmission lines 205, 215, and 255, before reflected pulses reach the load 250, the load dissipates half of the full energy stored in the first transmission line structure, i.e. in transmission lines 205 and 215. After reflection at the open end of transmission line 205 and at the short-circuit by switch 230, the end of the transmission line 215 positive pulse V0 and negative pulse (−V0/3) respectively reach the load as a resulting (combined) positive pulse (2V0/3). At the same moment the reflected pulse from the short-circuited end of transmission line 255 with reversed, i.e. negative polarity also reaches load 250. At this moment the voltage on the load will be reversed to the positive polarity with the same magnitude 2V0/3. During the second time period 2t this voltage will be on load 250 and the second half of the energy initially stored in transmission lines 205 and 215 will be dissipated into the load 250. The resulting pulse formed on the load is shown on FIG. 6b. Again, as for the FIG. 5a, after two 2t time periods of voltage on the load 250 full storage energy in the circuit will be transferred to this load. It could be noted that if the charging voltage on segment 210 with respect to segments 220 and 225 will be negative the bipolar pulse on the load will be started as positive pulse, i.e., similar to FIG. 5a.

Figure 7A:
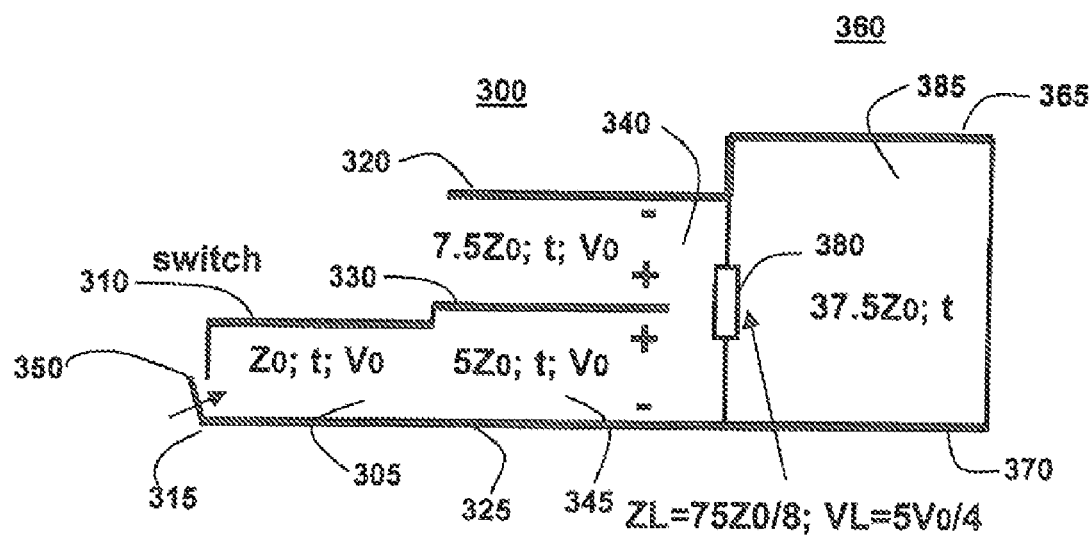
FIG. 7(a) depicts a schematic of a two-stage bipolar pulse generator according to an embodiment of the present invention.

FIG. 7a depicts a two-stage bipolar pulse generator according to an embodiment of the present invention. Referring to FIG. 7a, the first transmission line structure 300 includes first stage, which is transmission line 305 with two segments 310 and 315 and the second stage with three segments 320, 325 and 330. Segments 320 and 330 form transmission line 340, and segments 325 and 330 form transmission line 345. Segment 310 on the one side is connected to switch 350 and on the other side is connected to segment 330. The second transmission line structure includes segments 365 and 370 and load 380. Segment 365 and segment 370 form transmission line 385, which is coupled to load 380 and to the first transmission line structure 300.

Figure 7B:
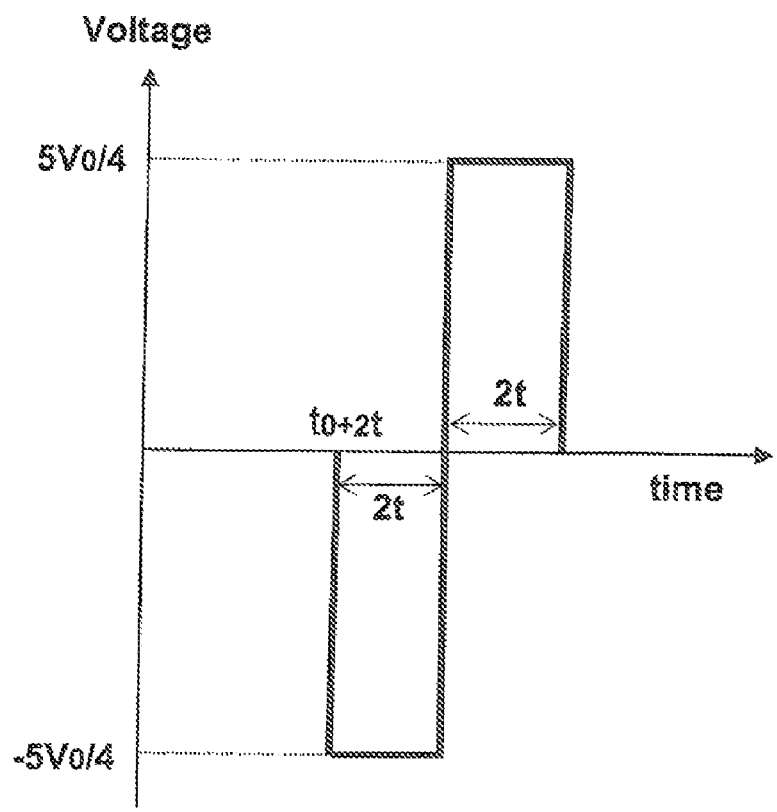
FIG. 7(b) depicts an ideal pulse form, provided by the generator of FIG. 7(a).

In addition, the impedance of transmission line 305 is equal Z0, and impedances of transmission lines 340, 345 and 385 are equal 7.5Z0, 5Z0 and 37.5Z0, respectively. The transit time of each transmission line is equal t. The impedance of load 380 is equal 75Z0/8. During the operation, transmission line segment 310 is charged at voltage V0 relative to segment 315. Segment 330, which is coupled to segment 310, is charged also at voltage V0 relative to segment 320 and to segment 325. When three transmission lines 305, 340 and 345 are completely charged the switch 350 closed, and at this moment a negative pulse (−V0) starts to propagate along the transmission line 305 toward transmission line 345. After time delay t, which is equal to transit time of transmission line 305 this pulse reaches transmission line 345 and part of energy reflected back to closed switch 350, and the rest of energy will continue to propagate on transmission line 345 toward its open end. After additional time period t (transit time of transmission line 345) this pulse appears at the open end of transmission line 345 and combines with charging voltage (−V0 ) of transmission line 340. Resulting pulse source with increased magnitude is loaded on second transmission line structure 360, i.e. on parallel connected impedances of load 380 and transmission line 385. As a result, negative pulse (−5V0/4) appears on the load and one quarter of load power pulse with the same magnitude (−5V0/4) starts to propagate on transmission line 385 toward its short-circuited end. At the same time another wave starts to propagate back on transmission lines 340 and 345. During the time period 2t before waves reflected from short-circuit end of transmission line 385 and waves reflected from the ends of transmission lines 340 and 345 reach the load 380, the voltage on this load still the same (−5V0/4), and half of energy initially stored in transmission lines 305, 340 and 345 dissipated in the load. After the last time period 2t, reflected positive pulses reach the load 380, and during additional time period 2t, they provide on the load 380 positive polarity pulse the same magnitude (5V0/4), and as a result full energy initially stored in circuit will be dissipated in the load 380. Pulse form on the load is depicted on FIG. 7b. Again, as for bipolar pulse generator (FIG. 6a) if the charging voltages on segments 310 and 330 will be negative with respect to segments 315 and 320-325 the polarity of the load pulse will be also opposite, i.e., as for FIG. 5b.

Figure 8:
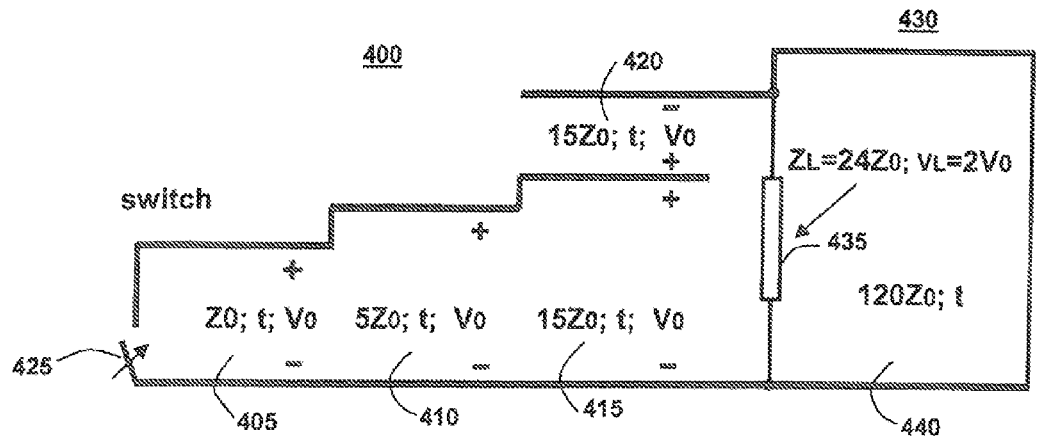
FIG. 8 depicts a schematic of a three-stage bipolar pulse generator according to an embodiment of the present invention.

FIG. 8 depicts a three-stage bipolar pulse generator according to an embodiment of the present invention. Referring to FIG. 8, the first transmission line structure 400 includes first stage, which is transmission line 405, the second stage, which is transmission line 410, and the third stage with two transmission lines 415 and 420. Switch 425 is connected between two segments of the first transmission line 405 in the same way as in FIGS. 6a and 7a. In addition, the last stage in first transmission line structure 400 has the same configuration as the last stage in FIG. 7a and as a single stage (except switch) in FIG. 6a. Moreover, the characteristic impedances of a stepped transmission lines at the same stages are equal. This means that referenced impedances of the first stage are equal for FIGS. 6a, 7a, and 8. The same is true for the second stage in FIGS. 7a and 8. Besides, the values of characteristic impedance of stepped transmission lines are different and increase for the steps further away from the switch. The second transmission line structure 430 is similar to the second transmission line structures in FIGS. 5a, 6a and 7a. This structure 430 includes transmission line 440 and load 435.

The load impedance and transformation ratio increases also with increasing the number of steps in the first transmission line structure. The load voltage for bipolar pulse generator (FIG. 8) is twice more compared to the charging voltage and appears at time delay 3t after closing switch 425. The process of forming pulse on the load 435 is generally similar to that for FIGS. 5a-7a with more steps of pulses propagation on the transmission lines.

Figure 9A:
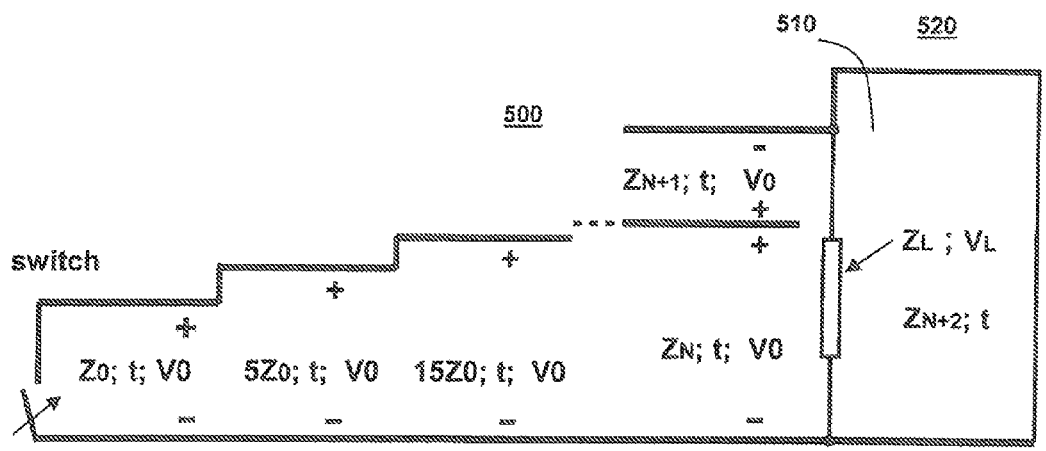
FIG. 9(a) depicts a schematic of a N-stage bipolar pulse generator according to an embodiment of the present invention.

Referring to FIG. 9a, according to an embodiment of the present invention, where additional steps in the first transmission line structure 500 are added to create N-stage bipolar pulse generator with increased voltage and impedance transformation ratios. FIGS. 6(a), 7(a), 8 and 9(a) show that characteristic impedances of stepped transmission lines may increase rapidly, for example, as 1:5:15, etc. This causes current in steps to decrease rapidly. Therefore, conductive losses decrease quickly from step to step. In addition, the steps may be one quarter wavelength of a fundamental frequency. All of this provides a high efficiency and smaller sized generator as compared with an exponential transformer. As N increases the relative energy traveling in transmission line 510 of the second transmission line structure 520 is lower and lower. That means the role of this line in formatting bipolar pulse is also lower and lower.

Detailed analysis of FIG. 9a indicates that this N-stage bipolar pulse generator is described below in terms of equations, which illustrate the achieved effect in voltage and impedance transformation.

$$\frac{Z_i}{Z_{i-1}} = \frac{i+3}{i-1} \quad i = 2, 3 \ldots N; Z_1 = 1 \tag{1}$$

$$\frac{Z_N}{Z_1} = Z_N = \prod_{i=2}^{N}\left(\frac{i+3}{i-1}\right) \quad i = 2, 3 \ldots N \tag{2}$$

$$\frac{Z_{N+1,i}}{Z_{N+1,i-1}} = \frac{i+3}{i} \quad i = 2, 3 \ldots N; Z_{N+1,1} = 3 \tag{3}$$

$$Z_{N+1} = 3 * \prod_{i=2}^{N}\left(\frac{i+3}{i}\right) \quad i = 2, 3 \ldots N \tag{4}$$

$$\frac{V_{LN}}{V_0} = \frac{2}{3} + \frac{1}{12}\sum_{i=2}^{N}(3+2i) \quad \text{where} \tag{5}$$

$V_{LN}$ is the load voltage on N-stages generator,
$V_0$—charging voltage $$\frac{Z_L}{Z_0} = 6\left(\frac{V_{LN}}{V_0}\right)^2, \text{ where} \tag{6}$$

$Z_L$—load impedance,
$Z_0$—impedance of the first transmission line (lowest value)

$$\frac{Z_{N+2}}{Z_L} = N + 2 \tag{7}$$

$Z_{N+2}$—impedance of the last line (short-circuited at the end)
Also, $$\frac{1}{Z_L} = \frac{1}{Z_N + Z_{N+1}} + \frac{1}{Z_{N+2}} \tag{8}$$

And, $$Z_N + Z_{N+1} = \frac{Z_{N+2}}{N+1} \tag{9}$$

For single stage (N=1) the ratio $$\frac{V_{LN}}{V_0} = 2/3.$$

Equation (5) highlights that with a transition to the second stage from the first one, the load voltage increases by the value $7V_0/12$, i.e. by $V_0/2+V_0/12$. Adding the third stage raises the load voltage by $V_0/2+V_0/12+V_0/6$. Adding the forth stage raises the load voltage by an extra $V_0/6$, i.e. totally by $V_0/2+V_0/12+V_0/6+V_0/6$. This process of raising the load voltage by the value of $V_0/6$ for each stage continues for any number of stages. This provides a rapid increase in the load voltage and, consequently, in load impedances (transformation ratio).

By comparison, in a Darlington's unipolar circuit, only the fixed value, $V_0/2$, is added to the load voltage for each additional stage. In addition, the Darlington structure differs from the proposed structure only by the absence of $(N+2)^{th}$ line short-circuited at its far end. Equation (7) verifies that with increasing number of stages N, the shunt effect of the transmission line with characteristic impedance $Z_{N+2}$ is decreasing, and the role of this line for large N is diminished.

Figure 9B:
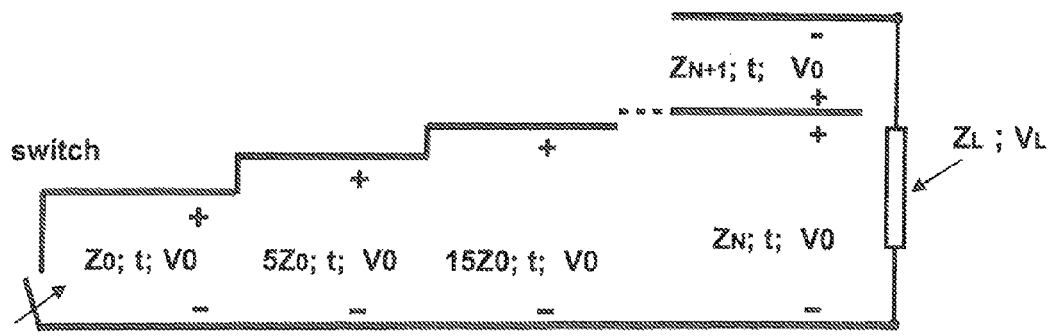
FIG. 9(b) depicts a simplified schematic of FIG. 9(a) after removing a short circuited transmission line according to an embodiment of the present invention.

Referring to FIG. 9b which depicts N-stage bipolar pulse generator according to an embodiment of the present invention, in which the transmission line in the second transmission line structure is removed. Numerical calculation indicates that practically effect of this line could be neglected in most cases for $N \geq 6$.

Referring to FIG. 10(a) which depicts N-stage bipolar pulse generator according to an embodiment of the present invention, in which the transmission line in the first stage is implemented as a stacked switched line. In this case relative to FIG. 9a the output power and load impedance are increases by factor n—the number of identical switched transmission lines in the first stage. In this case all switches must be closed at the same time.

Referring to FIG. 10(b), which depicts a N-stage bipolar pulse generator according to an embodiment of the present invention, the transmission line in the first stage is implemented as two identical transmission lines connected in parallel. In this very simple design, the characteristic impedance of each line in the first stage is equal to 2Z0. Therefore, the charging voltage (equal for all lines in the schematic) could be approximately twice the charging voltage on a transmission line with impedance Z0. This provides about three times increased power in the load if the voltage of all following stages with strip conductors is much lower, because of a rapid increase in the line's characteristic impedance.

In particular case, for fast photo-conductive switches, the maximum charging voltage is dictated by switch. Therefore, by using two or more parallel connected transmission lines in the first stage, the output power will be increased (approximately twice in the case of two parallel connected lines in the first stage). The only one switch is still needed to achieve this effect.

Figure 11:
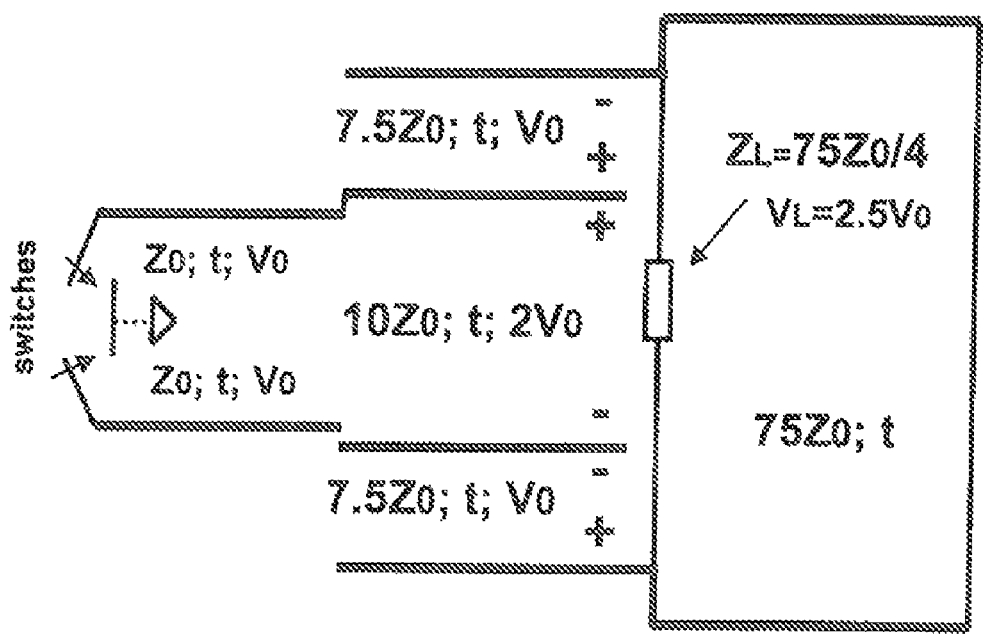
FIG. 11 depicts a schematic of a two-stage balanced bipolar pulse generator, according to an embodiment of the present invention.

Referring to FIG. 11 which depicts two-stage balanced bipolar pulse generator according to an embodiment of the present invention, in which compared to stacked design one conductor is excluded. It simplifies design, provides better efficiency and makes it possible to use a single switch. Characteristic impedances of all transmission lines are directly correlated to corresponding impedances of schematic shown on FIG. 7a.

Figure 12:
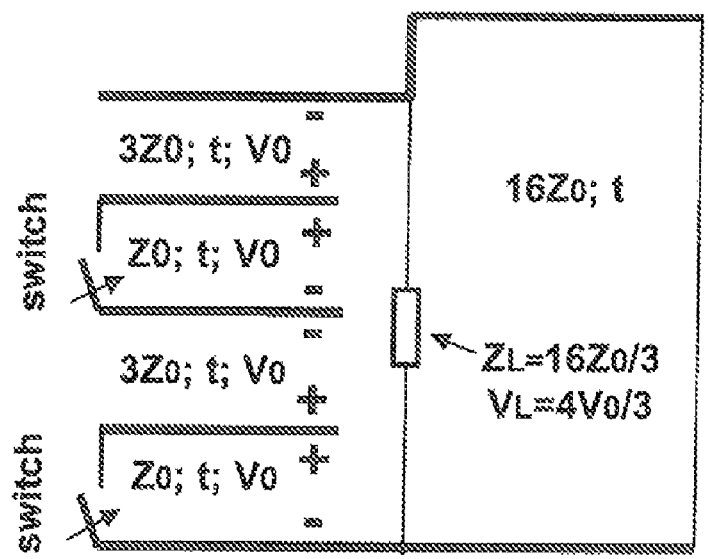
FIG. 12 depicts a schematic of two stacked single stage bipolar pulse generators prepared for impedance transformation according to an embodiment of the present invention.

Referring to FIG. 12 that depicts directly stacked single-stage bipolar pulse generator according to an embodiment of the present invention, which combined two identical bipolar pulse generators that are shown on FIG. 6a.

Figure 13:
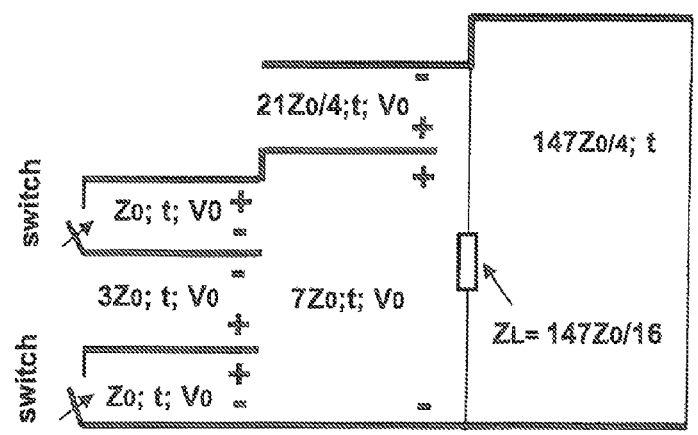
FIG. 13 depicts a schematic of a two-stage, stacked bipolar pulse generator according to an embodiment of the present invention.

Referring to FIG. 13 which depicts one of the possible schematic of two-stage stacked bipolar pulse generator according to an embodiment of the present invention, in which first transmission line structure consists of two identical switched transmission lines separated by non-switched transmission line with three times higher characteristic impedance. This implies the values of all other characteristic impedances and load impedance. Some different modifications of this structure or different relations between impedances in this structure are possible. Also, N-stage structures are possible in which the structures of all stages (except the first) will be the same, as in FIG. 9(a) or 9(b).

Figure 14:
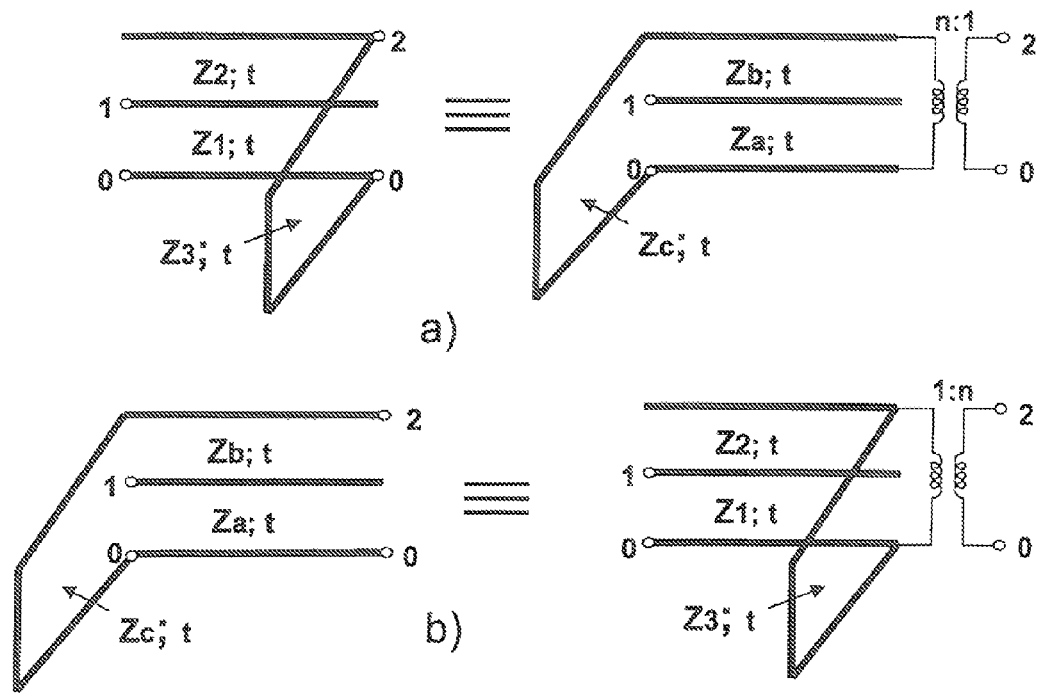
FIG. 14 depicts a schematic of a transmission line identity circuit configuration, according to an embodiment of the present invention.

FIG. 14 depicts transmission line identity according to an embodiment of the present invention. This identity allows converting, in particular, one circuit of bipolar pulse generator to another with different voltage (and impedance) transformation ratios. In circuits on FIGS. 14a,b transit time of all transmission lines is the same and not included in transformation. Correlation between characteristic impedances of transmission lines and values of voltage transformation coefficient n of ideal transformers are following:

1. For FIG. 14a:

$$Za = Z1 \cdot (Z1+Z3)/Z3 \tag{10}$$

$$Zb = Z2 \cdot (Z1+Z3)/(Z1+Z2+Z3) \tag{11}$$

$$Zc = (Z1+Z3)^2/(Z1+Z2+Z3) \tag{12}$$

$$n = 1 + Z1/Z3 \tag{13}$$

2. For FIG. 14b:

$$Z1 = Za \cdot (Zb+Zc)/(Za+Zb+Zc) \tag{14}$$

$$Z2 = Zb \cdot (Zb+Zc)/(Zc) \tag{15}$$

$$Z3 = (Zb+Zc)^2/(Za+Zb+Zc) \tag{16}$$

$$n = 1 + Za/(Zb+Zc) \tag{17}$$

It should be noted that after circuit converting the ideal transformer should be removed by recalculating impedances from one of its sides to another.

Figure 1A:
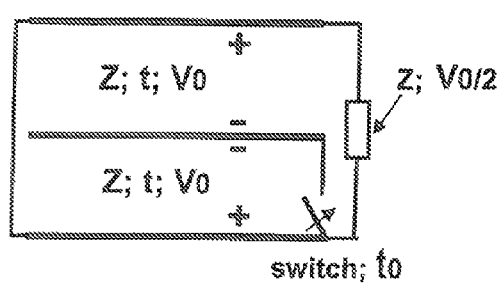
FIG. 1(a) depicts a schematic of an unfolded bipolar pulse generator according to the prior art.
Figure 1B:
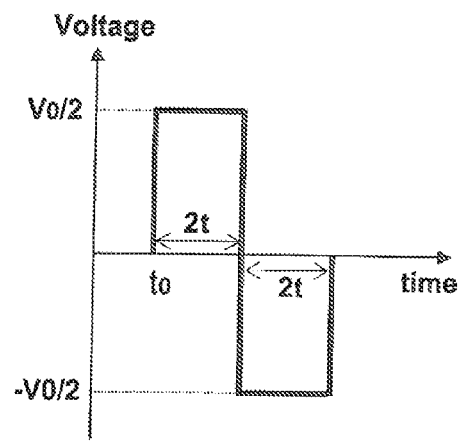
FIG. 1(b) depicts an ideal pulse form, provided by the generator of FIG. 1(a).
Figure 2:
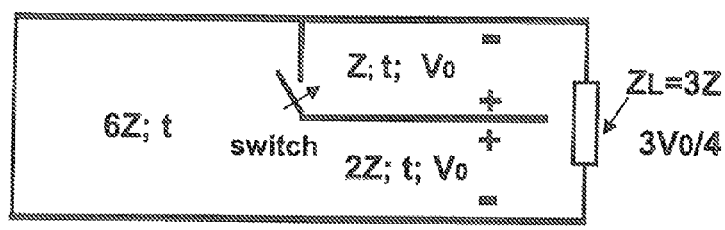
FIG. 2 depicts a schematic of a three transmission line bipolar pulse generator according to the prior art.
Figure 3:
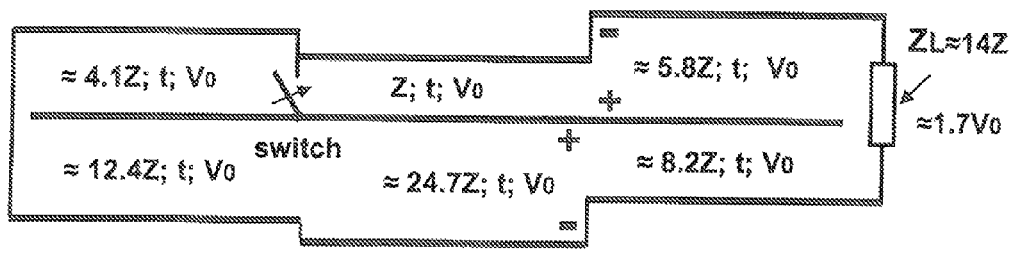
FIG. 3 depicts a schematic of a six transmission line bipolar pulse generator with increase load impedance and voltage according to the prior art.
Figure 4:
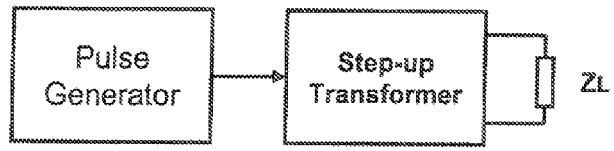
FIG. 4 depicts a block diagram of a bipolar pulse generator according to the prior art.
Figure 15:
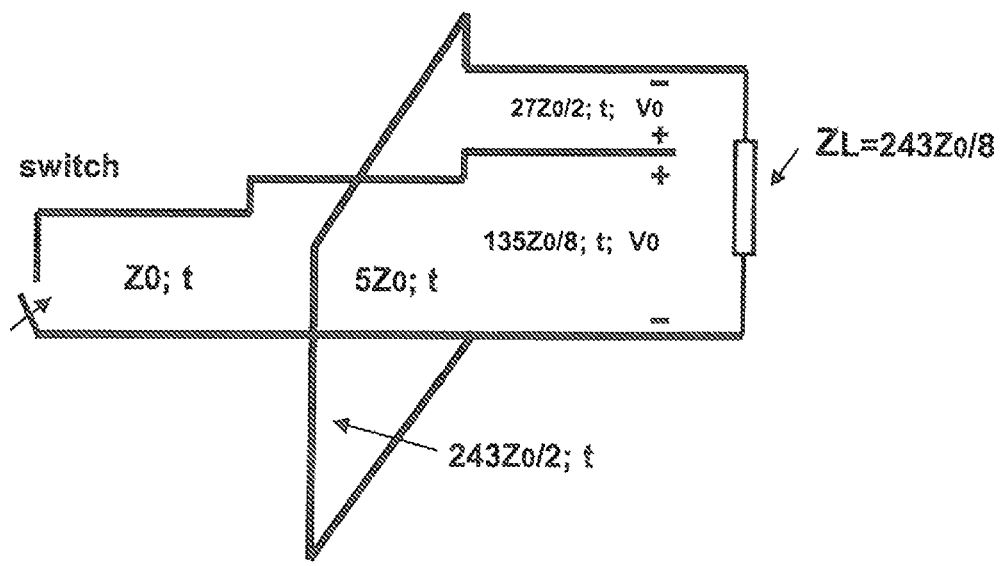
FIG. 15 depicts a schematic of a three-stage bipolar pulse generator obtained by applying circuit configurations 14 to the schematic of FIG. 8.

Referring to FIG. 15 that depicts bipolar pulse generator according to an embodiment of the present invention, which is obtained as an example of applying transmission line identity (FIG. 14a) to circuit illustrated on FIG. 8. This circuit transformation provides increasing voltage and impedance transformation ratios and could be applied to general circuits that are shown on FIGS. 9a, 10(a,b), 11 and 13 with any number of stages. As a result, there exists an infinity of different bipolar pulse generators that could be obtained by using concepts illustrated in figures of this patent. It also may be noted that the prior art bipolar pulse generator depicted on FIG. 2 could be considered as a result of applying transmission line identity (FIG. 14a) to FIG. 6a of the present invention, including FIG. 10(b) with two or more parallel connected transmission lines in a first stage.

Figure 16:
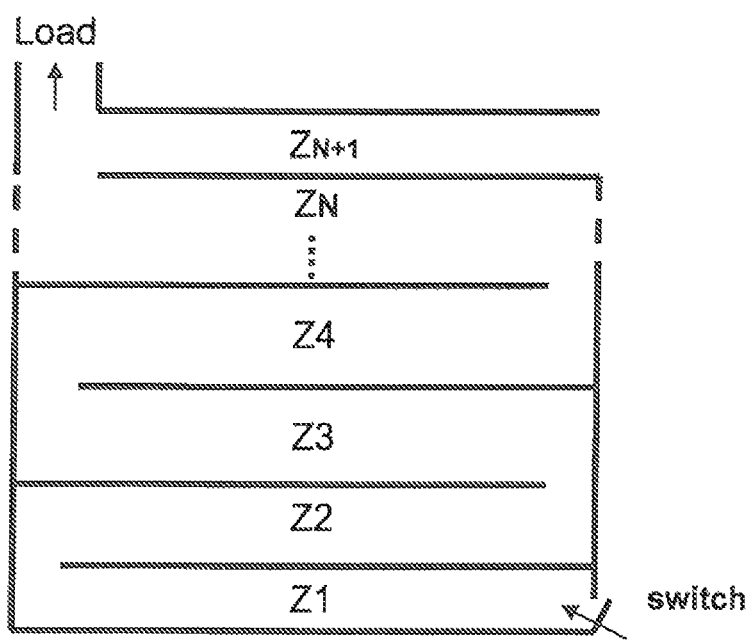
FIG. 16 depicts a folded design of a N-stage bipolar pulse generator as shown in FIG. 9b without a short circuited transmission line with characteristic impedance of $Z_{N+2}$, according to an embodiment of the present invention.

FIG. 16 depicts folded design of bipolar pulse generator as an embodiment of the present invention, which is applied to the structure shown on FIG. 9b. The same method of folding could be applied to different structures of bipolar pulse generators of the present invention.

FIG. 17 illustrates the tabular result of calculations of normalized values of transmission lines characteristic impedances, load impedances and voltage transformation ratios for bipolar pulse generators that shown on FIG. 9a and main parameters obtained after applying transmission line identity illustrated on FIG. 14a. This table shows that maximum effect in transformation is achieved for N=2.

Figure 18:
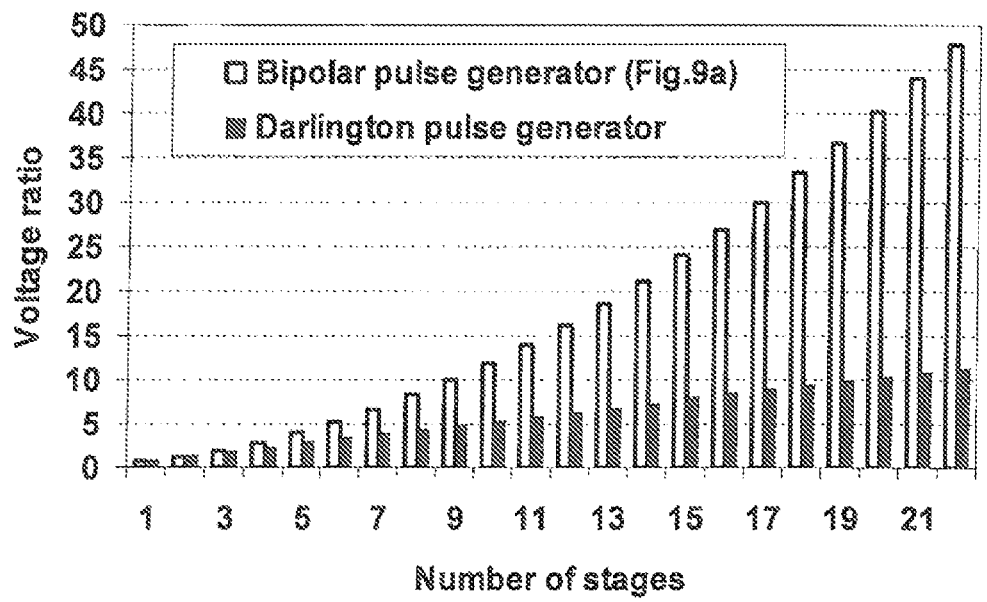
FIG. 18 depicts a graph of voltage ratios for the bipolar pulse generator of FIG. 9(a) in comparison to unipolar pulse Darlington type generators.

FIG. 18 illustrates the effect voltage transformation ratios for bipolar pulse generator (FIG. 9a) in comparison with unipolar Darlington pulse generator that has the same transmission line structure, except for the absence of short-circuited at the end transmission line with characteristic impedance $Z_{N+2}$. As it was mentioned above this transmission line could be practically excluded for $N \geq 6$.

Figure 19:
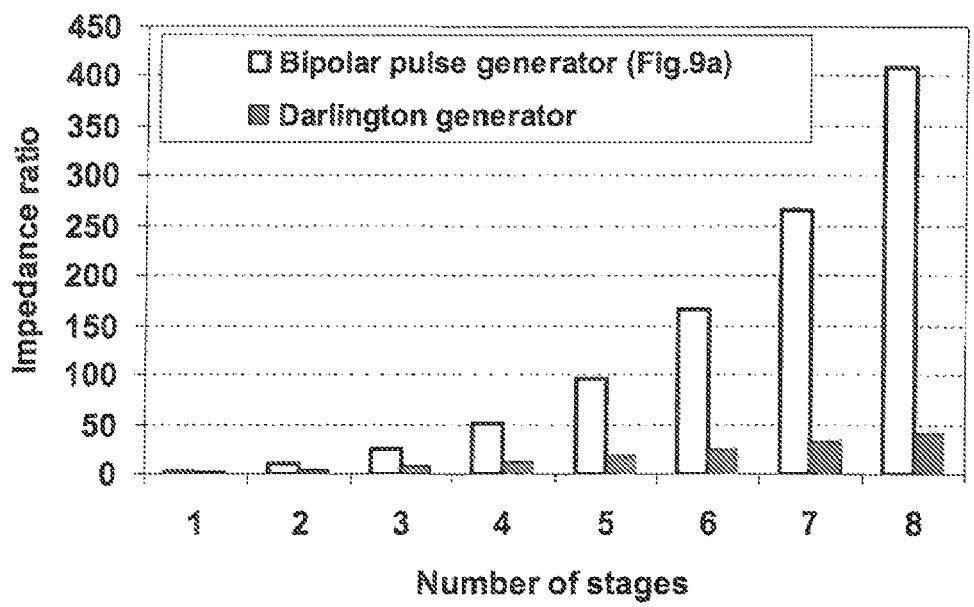
FIG. 19 depicts a graph of impedance transformation ratios for bipolar pulse generator in comparison with Darlington type unipolar pulse generators for bipolar pulse generators having 1 to 8 stages.

FIG. 19 illustrates the effect in impedance transformation ratios for the same pulse generators. As we can see the effect increases for an increased number of stages.

Figure 20:
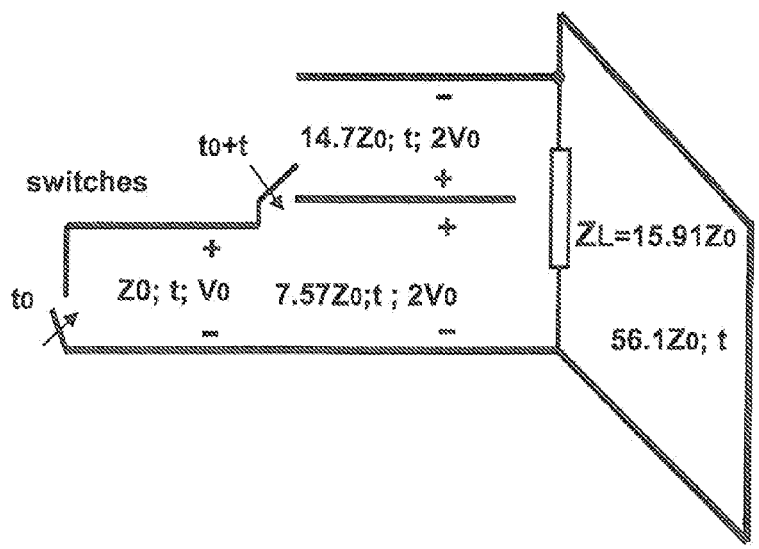
FIG. 20 depicts a schematic of a two-stage bipolar pulse generator with different charging voltages according to an embodiment of the present invention.

Referring to FIG. 20 that depicts two-stage balanced bipolar pulse generator according to an embodiment of the present invention, in which the second stage is charged at double voltage compared to the first stage, and consequently, any additional switch is used. This bipolar pulse generator provides higher impedance transformation compared to that of FIG. 7a. This approach could be used for two-and more stage bipolar pulse generators presented in this patent, including circuits such as those shown in FIGS. 10(a,b).

Figure 21:
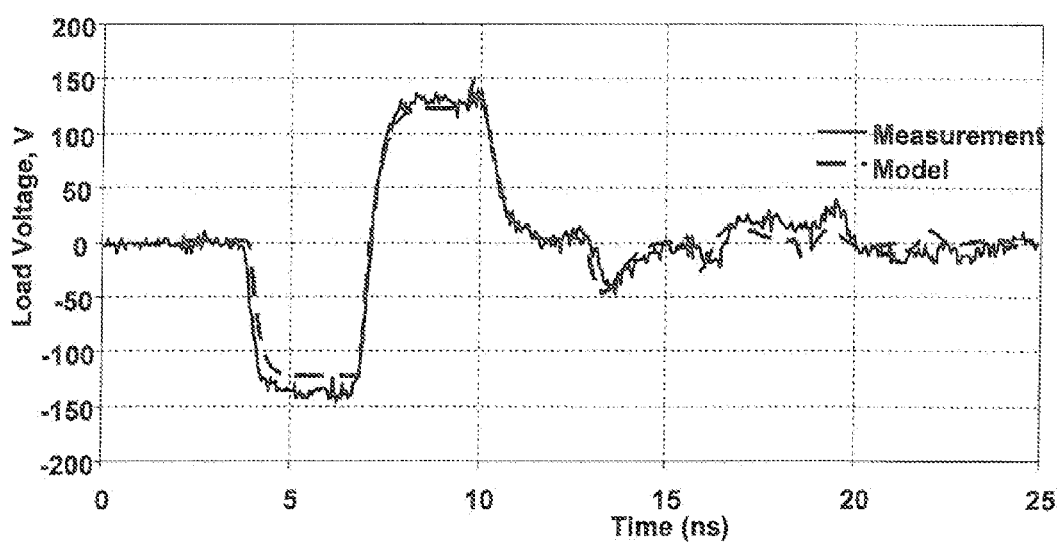
FIG. 21 illustrates a comparison of an experimental graph and modeling for the circuit shown in FIG. 7 with a 5.33:50 ohm impedance transformation.

FIG. 21 illustrates experimental and computer modeling characteristics for real design of two-stage bipolar pulse generator according to FIG. 7a that provides impedance transformation as indicated in table on FIG. 17.

Figure 22A:
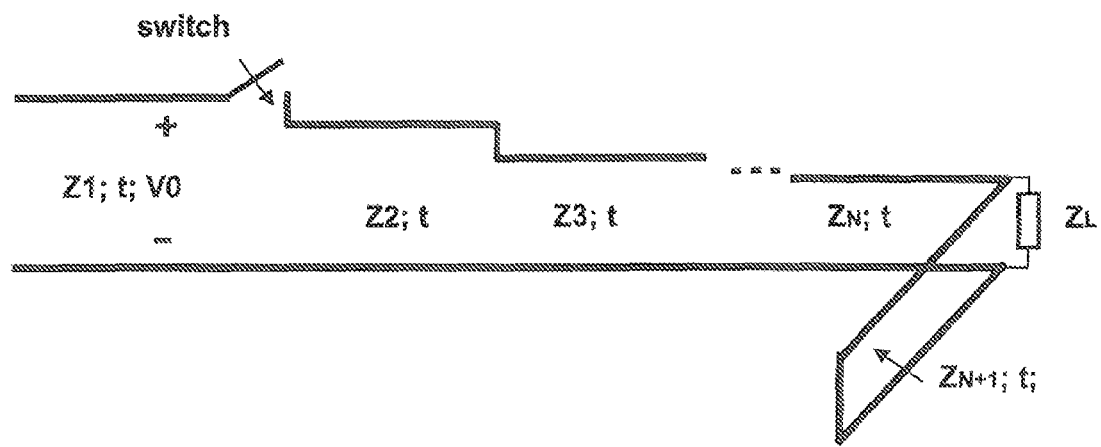
FIG. 22(a) depicts a N-stage schematic of a bipolar pulse generator with current multiplication according to an embodiment of the present invention.

FIG. 22a depicts N-stage bipolar pulse generator according to an embodiment of the present invention, which provides current multiplication.

For this generator the characteristic impedances of stepped transmission lines Zi (i=1, 2, 3, ..., N) are defined as:

$$Zi = 2 \cdot Z1/i \cdot (i+1) \quad (18)$$

Characteristic impedance $Z_{N+1}$ of short-circuited at one end transmission line, which shunt load impedance at another end is defined as:

$$Z_{N+1} = 2 \cdot Z1/(N+1) \quad (19)$$

The load impedance $Z_L$ is defined as:

$$Z_L = Z_N \cdot Z_{N+1}/(Z_N + Z_{N+1}), \text{ or for conductances } Y_L = Y_N + Y_{N+1} \quad (20)$$

If we define current $I_0 = V0/2Z1$ (N=1) the current in the load $I_L$ and voltage on the load $V_L$ could be defined as:

$$I_L/I_0 = (N+1)/2, \; I_L/V_0 = (N+1)/4Z1, \; V_0/V_L = 2(N+1) \; N \geq 1 \quad (21)$$

Figure 22B:
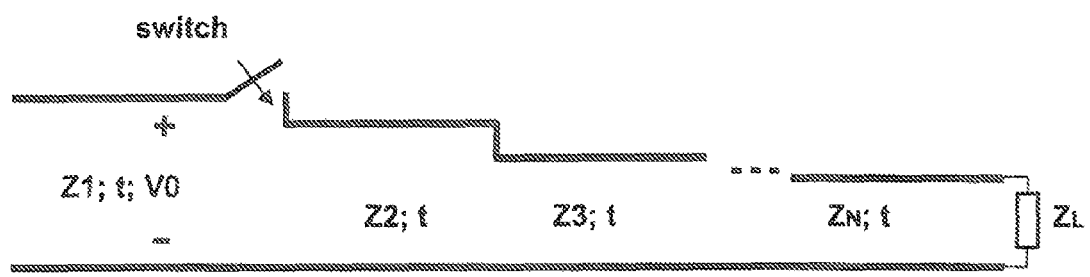
FIG. 22(b) depicts a schematic of FIG. 22(a) after removing a short circuited transmission line, according to an embodiment of the present invention.

Again, as in bipolar pulse generator with voltage multiplication (FIG. 9a) with increasing number of stages N the lower and lower energy transferred in transmission line with impedance $Z_{N+1}$. In most practical cases, for $N \geq 6$ this transmission line could be removed, as illustrated on FIG. 22b, by analogy with FIG. 9b.

While particular embodiments have been shown and described, changes may be made to those embodiments without departing from the spirit and scope of the present invention.

What is claimed is:

1. A bipolar pulse generator comprising:
    a voltage charged transmission line structure which is a multi-staged transmission line circuit having a first stage and a last stage and at least two conductors in each stage;
    a load coupled across the outer conductors of the last stage of the multi-staged transmission line circuit; and
    at least two common conductors shared between the first stage and the last stage of the multi-step transmission line circuit, wherein:
    the last stage of the multi-step transmission line circuit comprises at least four conductors proximal to the load; and
    the first stage of the multi-stage transmission line circuit is distal from the load and comprises the at least two common conductors that are switchably coupled together.

2. The bipolar pulse generator of claim 1, further comprising an uncharged transmission line structure coupled at a first end to the load and short circuited at a second end.

3. The bipolar pulse generator of claim 1, wherein the multi-staged transmission line circuit comprises at least one middle stage between the first stage and the last stage, said middle stage having at least two conductors of opposite polarity charge.

4. The bipolar pulse generator of claim 1, wherein every stage of the multi-staged transmission line circuit has the same transit time.

5. The bipolar pulse generator of claim 1, wherein the at least two common conductors are switchably coupled together using a single switch.

6. The bipolar pulse generator of claim 2, wherein the at least two common conductors form at least one inner transmission line at the last stage of the multi-staged transmission line circuit, said inner transmission line positioned between the outer conductors of the last stage of the multi-staged transmission line circuit.

7. The bipolar pulse generator of claim 6, wherein the outer conductors of the last stage of the multi-staged transmission line circuit, along with conductors from the inner transmission line, form two outer transmission lines that have the same voltage and impedance values.

8. The bipolar pulse generator of claim 7, wherein the voltage across the inner transmission line is greater than the voltage across either of the two outer transmission lines.

9. The bipolar pulse generator of claim 7, wherein the two common conductors form a single transmission line having an impedance Z0 at the first stage, and wherein the two outer transmission lines, the inner transmission line, and the uncharged transmission line structure have impedance values of 7.5Z0, 10Z0, and 75Z0, respectively.

10. The bipolar pulse generator of claim 1, wherein:
    the multi-staged transmission line circuit comprises two stages;
    the first stage comprises the two common conductors forming a two-conductor transmission line; and
    the last stage comprises the four conductors forming two outer transmission lines and one inner transmission line, the inner transmission line comprising the two common conductors.

* * * * *